(12) United States Patent
Matsuoka et al.

(10) Patent No.: US 12,434,378 B2
(45) Date of Patent: Oct. 7, 2025

(54) HORIZONTAL ARTICULATED ROBOT AND SUBSTRATE TRANSFER SYSTEM COMPRISING SAME

(71) Applicant: Kawasaki Jukogyo Kabushiki Kaisha, Kobe (JP)

(72) Inventors: Junichi Matsuoka, Kobe (JP); Masaru Yamasaki, Kobe (JP); Yuichiro Tanaka, Kobe (JP)

(73) Assignee: KAWASAKI JUKOGYO KABUSHIKI KAISHA, Kobe (JP)

( * ) Notice: Subject to any disclaimer, the term of this patent is extended or adjusted under 35 U.S.C. 154(b) by 114 days.

(21) Appl. No.: 17/797,731

(22) PCT Filed: Feb. 2, 2021

(86) PCT No.: PCT/JP2021/003669
§ 371 (c)(1),
(2) Date: Aug. 5, 2022

(87) PCT Pub. No.: WO2021/157552
PCT Pub. Date: Aug. 12, 2021

(65) Prior Publication Data
US 2023/0071716 A1 Mar. 9, 2023

(30) Foreign Application Priority Data
Feb. 7, 2020 (JP) ................. 2020-019879

(51) Int. Cl.
*B25J 9/04* (2006.01)
*H01L 21/677* (2006.01)
*H01L 21/687* (2006.01)

(52) U.S. Cl.
CPC ........ *B25J 9/042* (2013.01); *H01L 21/67742* (2013.01); *H01L 21/68707* (2013.01)

(58) Field of Classification Search
CPC ..... B25J 9/042; B25J 9/043; H01L 21/68707; H01L 21/67742; H01L 21/67766
See application file for complete search history.

(56) References Cited

U.S. PATENT DOCUMENTS

| 6,893,204 B1* | 5/2005 | Suzuki ............... B65G 49/067 414/744.5 |
| 2008/0025824 A1 | 1/2008 | Hashimoto |
| 2015/0190933 A1* | 7/2015 | Kremerman ...... H01L 21/67742 414/806 |
| 2015/0258693 A1 | 9/2015 | Yazawa et al. |

FOREIGN PATENT DOCUMENTS

| JP | 03073291 A | * 3/1991 |
| JP | H03-073291 A | 3/1991 |
| JP | 2003266344 A | * 9/2003 |

(Continued)

*Primary Examiner* — Gerald McClain
(74) *Attorney, Agent, or Firm* — XSENSUS LLP

(57) ABSTRACT

A robot 100 includes: a base 1; an arm 3 coupled to the base 1 to be rotatable horizontally and formed by links 30 coupled to one another to be rotatable horizontally; and a hand 8 coupled to the arm 3 to be rotatable horizontally. A first link 31 that is at least one link of the links 30 has an internal space 40. The first link 31 has a partition 45 that partitions the internal space 40 into two container rooms each for housing a component, that is, a first container room 40A and a second container room 40B.

11 Claims, 7 Drawing Sheets

(56) References Cited

FOREIGN PATENT DOCUMENTS

| | | | | |
|---|---|---|---|---|
| JP | 2004359343 | A | | 12/2004 |
| JP | 2005010699 | A | * | 1/2005 |
| JP | 2007-38360 | A | | 2/2007 |
| JP | 2008-28134 | A | | 2/2008 |
| JP | 2013-49128 | A | | 3/2013 |
| JP | 2013049128 | A | * | 3/2013 |
| JP | 2015-36186 | A | | 2/2015 |
| JP | 2017-503666 | A | | 2/2017 |
| TW | 201410417 | A | | 3/2014 |
| WO | 2015/103089 | A1 | | 7/2015 |

* cited by examiner

HORIZONTAL ARTICULATED ROBOT AND SUBSTRATE TRANSFER SYSTEM COMPRISING SAME

CROSS-REFERENCE TO RELATED APPLICATIONS

The present application is based on PCT filing PCT/JP2021/003669, filed Feb. 2, 2021, which claims priority to JP 2020-019879, filed Feb. 7, 2020, the entire contents of each are incorporated herein by reference.

FIELD

The technique disclosed here relates to a horizontal articulated robot and a substrate transfer system including the robot.

BACKGROUND

There have been known a horizontal articulated robot and a substrate transfer system including the robot. For example, a horizontal articulated robot described in Patent Document 1 includes a base, an arm, and an end effector. The arm is coupled to the base to be rotatable horizontally and is formed by links coupled to each other to be horizontally rotatable.

CITATION LIST

Patent Document

Patent Document 1: Japanese Patent Application Publication No. 2015-36186

SUMMARY

Technical Problem

In the thus-configured horizontal articulated robot, each link has the function of accommodating components in addition to functions of the link itself. For example, the arm includes a component related to driving of the arm and a component related to detection of operation of the arm, for example. At least some of these components are housed in the link. The robot described in Patent Document 1 includes links and motors for driving an end effector. For example, two motors for driving two end effectors are housed in a foremost link in the arm.

In the configuration in which components are housed in a link, the link has a heavy total weight, and thus, the link has preferably high rigidity. With high rigidity of the link, the arm has high rigidity, and as a result, positioning accuracy of the end effectors increases. In particular, since the link that houses motors as described above has a heavy total weight, high rigidity is required.

It is therefore an object of the technique disclosed here to increase rigidity of links in a horizontal articulated robot.

A horizontal articulated robot disclosed here includes: a base; an arm coupled to the base to be rotatable horizontally and formed by links, the links being coupled to one another to be rotatable horizontally, and an end effector coupled to the arm to be rotatable horizontally, wherein at least one link of the links has an internal space, and the at least one link has a partition partitioning the internal space into two container rooms each configured to house a component.

A substrate transfer system disclosed here includes: a casing; and the horizontal articulated robot disposed in the casing, wherein the horizontal articulated robot transfers a substrate between an enclosure and a processor, the case being adjacent to the casing and configured to house the substrate, the processor being configured to process the substrate.

The horizontal articulated robot has increased rigidity of the links.

DESCRIPTION OF EMBODIMENTS

An exemplary embodiment will be described in detail hereinafter with reference to the drawings.

Figure 1:
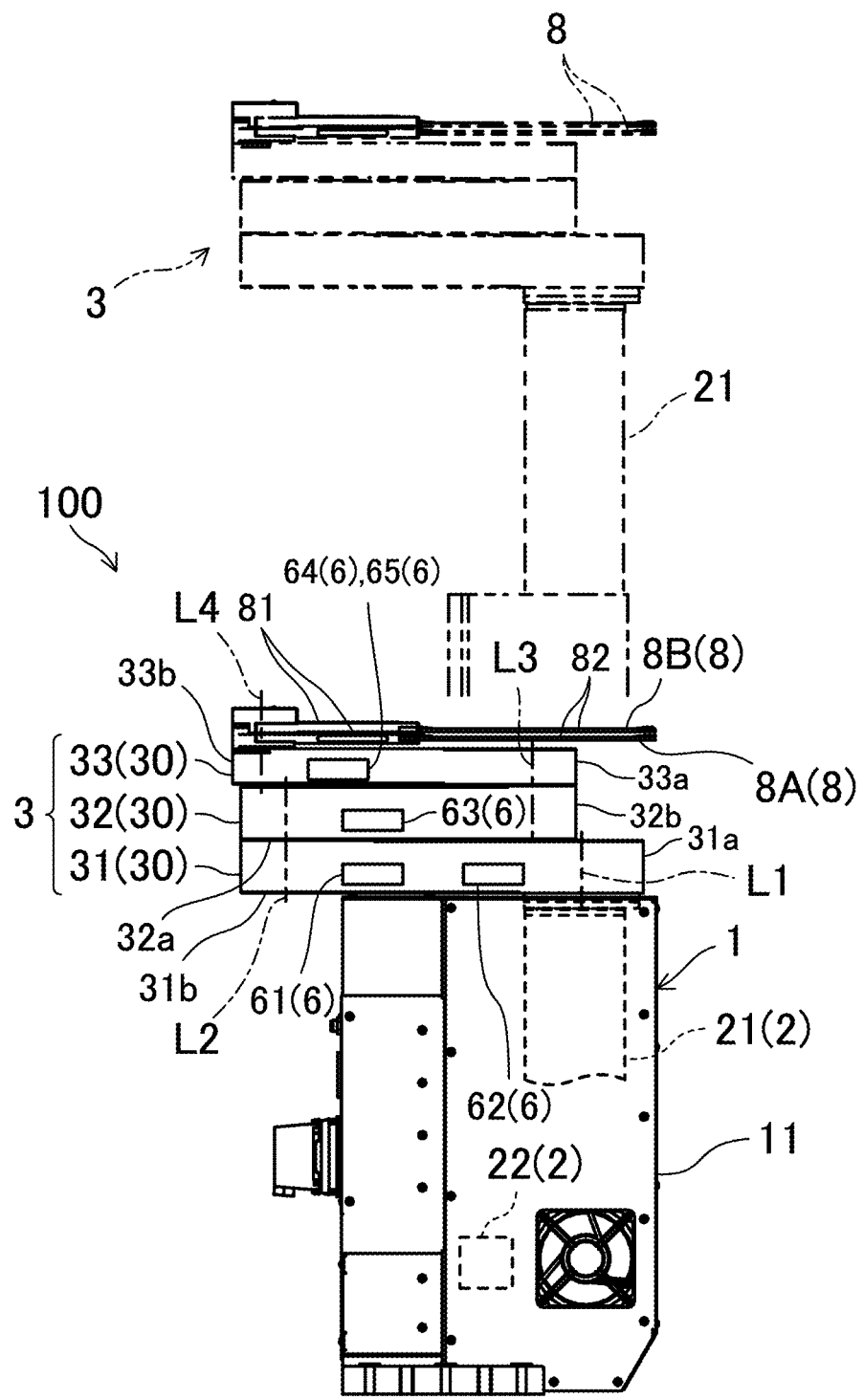
FIG. 1 is a side view of a horizontal articulated robot.

FIG. 1 is a side view of a horizontal articulated robot 100. The horizontal articulated robot (hereinafter referred to as a "robot") 100 is a robot of a selective compliance assembly robot arm (SCARA) type. The robot 100 includes a base 1, an arm 3 coupled to the base 1 to be rotatable horizontally, and hands 8 coupled to the arm 3 to be rotatable horizontally. The arm 3 is formed by links 30 coupled to one another to be rotatable horizontally. The hands 8 hold an object. The object is, for example, a substrate S. The hands 8 are an example of end effectors.

Figure 2:
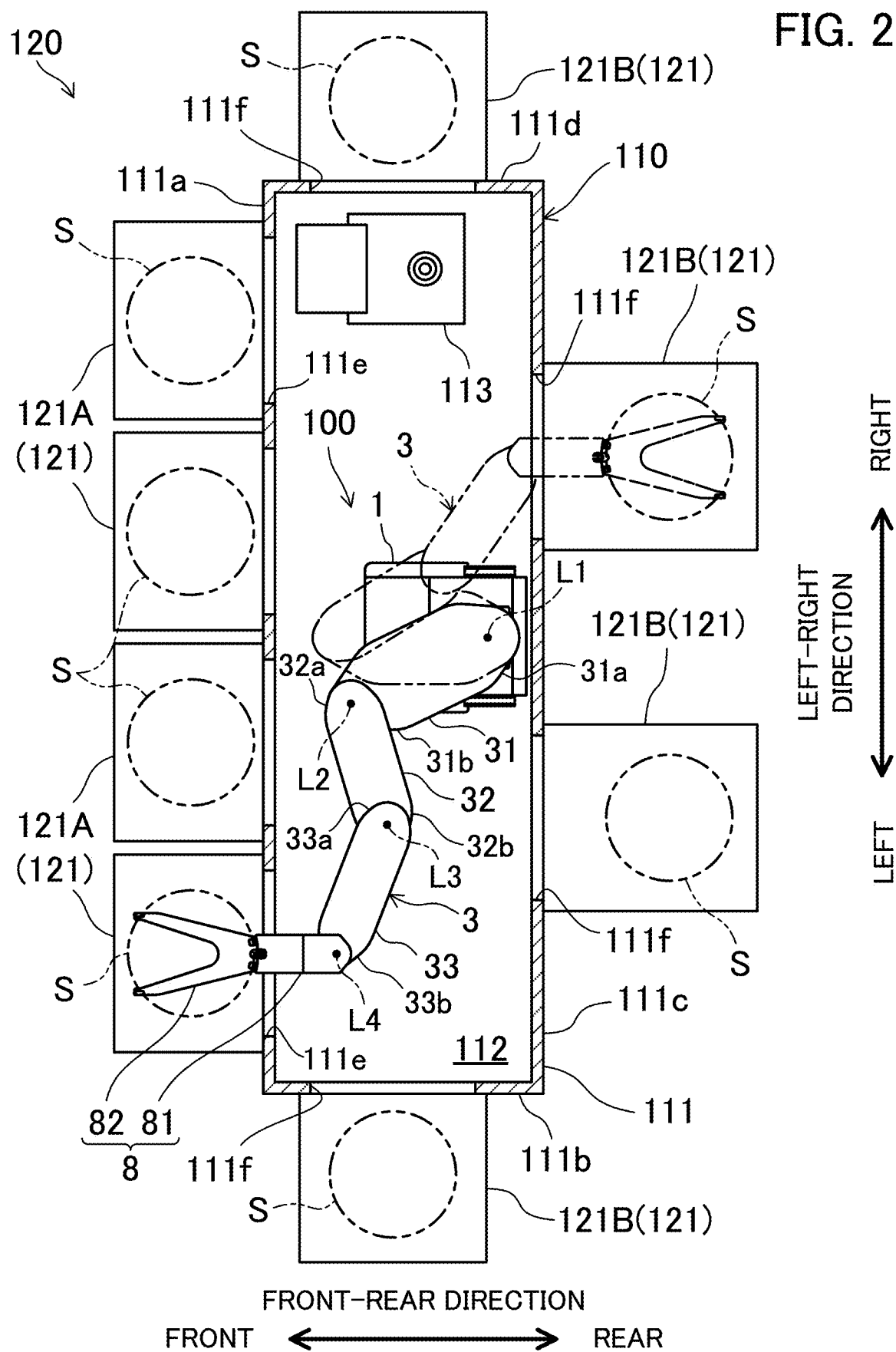
FIG. 2 is a plan view schematically illustrating a substrate processing apparatus.

FIG. 2 is a plan view schematically illustrating a substrate processing apparatus 120. The robot 100 is incorporated in, for example, a substrate transfer system 110 for transferring a substrate S. The substrate transfer system 110 includes a casing 111 and the robot 100. For example, the substrate transfer system 110 is an equipment front end module (EFEM). The substrate transfer system 110 conforms to a semiconductor equipment and materials international (SEMI) standard. The substrate transfer system 110 may conform to another standard other than the SEMI standard.

A transfer space 112 is formed in the casing 111. The robot 100 is disposed in the casing 111, that is, in the transfer space 112. The robot 100 transfers the substrate S in the transfer space 112. The substrate S is, for example, a disc-shaped semiconductor wafer. Hereinafter, for convenience of description, a front-rear direction, a left-right direction, and a top-bottom direction (i.e., a vertical direction) that are orthogonal to one another are defined.

The casing 111 has a substantially rectangular parallelepiped box shape. The casing 111 includes a front wall 111a and a rear wall 111b opposed to each other in the front-rear direction, an incorporated left wall 111c and a right wall 111d opposed to each other in the left-right direction, and a ceiling wall (not shown) and a bottom wall (not shown) opposed to each other in the top-bottom direction. A distance between the left wall 111c and the right wall 111d is larger than a distance between the front wall 111a and the rear wall 111b. That is, the casing 111 has a substantially rectangular shape elongated in the left-right direction in a plan view. The transfer space 112 is cleaned. An ambient gas filling the transfer space 112 is adjusted with, for example, a fine filter unit. The transfer space 112 is provided with an aligner 113 for positioning the substrate S.

For example, the substrate transfer system 110 is incorporated in the substrate processing apparatus 120. The substrate processing apparatus 120 includes the substrate transfer system 110 and containers 121 each configured to house the substrate S. A container room is formed in each of the containers 121. The container room is cleaned. For example, each of the containers 121 includes a front opening unified pod (FOUP) 121A and a processor 121B. The FOUPs 121A houses the substrate S. The processor 121B processes the substrate S. The FOUPs 121A and the processors 121B are adjacent to the casing 111. Each of the FOUPs 121A is an example of an enclosure for housing a semiconductor wafer.

Each of the FOUPs 121A is configured to house a substrate S before processing and a substrate S after processing. The FOUPs 121A are substrate enclosures for a mini-environment. Each FOUP 121A houses substrates S in a horizontal state such that the substrates S are spaced from one another in the vertical direction. The FOUPs 121A are disposed outside the casing 111 and attached to the front wall 111a with FOUP openers (not shown) interposed therebetween. In this example, four FOUPs 121A are provided. The four FOUPs 121A are arranged with regular intervals in the left-right direction. The front wall 111a has openings 111e corresponding to the FOUPs 121A. The FOUP openers switch the connection state between the transfer space 112 and the internal spaces of the FOUPs 121A between connection and disconnection.

Each of the processors 121B is, for example, a processor that performs heat treatment, impurity introduction, thin-film formation, lithography, cleaning, planarization, or inspection of appearance or size on the substrates S. Alternatively, processing performed by each processor 121B may be temporary housing for transferring the substrates S. The rear wall 111b is provided with two processors 121B, the left wall 111c is provided with one processor 121B, and the right wall 111d is provided with one processor 121B. The processors 121B are disposed outside the casing 111. The walls have openings 111f corresponding to the processors 121B. The openings 111f may be equipped with doors (not shown). The connection state between the transfer space 112 and the internal spaces of the processors 121B is switched between connection and disconnection by opening and closing the doors.

In such a configuration, the robot 100 included in the substrate transfer system 110 transfers semiconductor wafers between the FOUPs 121A for housing the semiconductor wafers and the processors 121B for processing the semiconductor wafers. Specifically, the hands 8 hold the semiconductor wafer as the substrate S. The arm 3 and the hands 8 transfer the semiconductor wafer between the FOUPs 121A and the processors 121B <Configuration of Robot 100>

A configuration of the robot 100 will be described with reference to FIGS. 1 and 2.

The base 1 includes the casing 11 and an elevation mechanism 2 that lifts and lowers the arm 3 in the vertical direction. The casing 11 has a substantially rectangular parallelepiped shape. The elevation mechanism 2 includes a movable part 21 and an elevation motor 22 that drives the movable part 21. The movable part 21 has a columnar shape. In a state where the movable part 21 is at the lowest position, most part of the movable part 21 is housed in the casing 11. The movable part 21 elevates to project upward from the casing 11. The arm 3 is coupled to an upper end portion of the movable part 21 to be rotatable horizontally. As indicated by solid lines and chain double-dashed lines in FIG. 1, when the movable part 21 moves upward and downward, the arm 3 and the hands 8 move upward and downward accordingly.

The arm 3 is formed by three links 30. In the case of distinguishing the three links 30, the links 30 are referred to as a first link 31, a second link 32, and a third link 33 in the order from the side close to the base 1. The first link 31 is the link 30 coupled to the base 1. The hands 8 are coupled to the third link 33.

Each of the links 30 has a shape elongated in a predetermined longitudinal direction. Hereinafter, unless otherwise specified, an end of each link 30 in the longitudinal direction will be referred to as a first end and the other end of the link 30 opposite to the first end in the longitudinal direction will be referred to as a second end. Unless otherwise specified, a "lateral direction" of each link 30 refers to a direction orthogonal to both the vertical direction and the longitudinal direction of the link 30.

A first end 31a of the first link 31 is coupled to the base 1 to be rotatable about a first axis L1 extending in the vertical direction. Specifically, the first end 31a is coupled to an upper end portion of the movable part 21. A first end 32a of the second link 32 is coupled to a second end 31b of the first link 31 to be rotatable about a second axis L2 extending in the vertical direction. A first end 33a of the third link 33 is coupled to a second end 32b of the second link 32 to be rotatable about a third axis L3 extending in the vertical direction. The first axis L1, the second axis L2, and the third axis L3 are parallel. The length (i.e., dimension in the longitudinal direction) of the first link 31 is the largest among those of the three links 30.

The robot 100 includes two hands 8, that is, a first hand 8A and a second hand 8B. When the first hand 8A and the second hand 8B are not distinguished from each other, each of the first hand 8A and the second hand 8B is referred to simply as the "hand 8." The first hand 8A and the second-hand 8B have the same basic configuration. In FIG. 2, two hands 8 overlap each other in the vertical direction, and thus, only one hand 8 is shown apparently.

Holding by the hand 8 can be implemented in various modes such as gripping, adsorption, placement, or fitting. The hand 8 includes a body 81 and a holder 82 coupled to the body 81 and branched into two. The hand 8 has a plate shape. The hand 8 has a substantially Y shape when seen in the thickness direction thereof. The hand 8 includes a holding actuator (not shown) such as an air cylinder. The holding actuator switches the hand 8 between a holding state and a release state.

The body 81 of each hand 8 is coupled to the second end 33b of the third link 33 to be rotatable about a fourth axis L4 extending in the vertical direction. The fourth axis L4 is parallel to the first axis L1, the second axis L2, and the third axis L3.

The first link 31, the second link 32, the third link 33, the first hand 8A, and the second hand 8B are stacked from the bottom in this order and are not in contact with one another. The first link 31, the second link 32, the third link 33, and the two hands 8 rotate horizontally without interference with one another.

The robot 100 includes various components. Examples of the components include components related to driving of the arm 3 and the hands 8 (hereinafter referred to as the "arm 3 and others") and components related to detection of operation of the arm 3 and others. Examples of the components related to driving of the arm 3 and others include motors 6 for rotationally driving the links 30 and the hands 8, transfer mechanisms corresponding to the motors 6, and components related to holding actuators (not shown) for holding and releasing an object by the hand 8. In a case where the components related to the holding actuators are air cylinders, for example, examples of the components related to the holding actuators include pipes for supplying air to the air cylinders and solenoid valves for switching air supply. In a case where the hand 8 holds an object by adsorption, examples of the components related to detection of operation of the arm 3 and others include a pressure sensor that is provided in a pipe for sucking air from an adsorber of the hand 8 and detects the pressure in the pipe. The components related to driving of the arm 3 and others and the components related to detection of operation the arm 3 and others include a harness and a pipe.

The motors 6 include a first motor 61 for rotationally driving the first link 31, a second motor 62 for rotationally driving the second link 32, a third motor 63 for rotationally driving the third link 33, a fourth motor 64 for rotationally driving the first hand 8A, and a fifth motor 65 for rotationally driving the second hand 8B. When the first motor 61, the second motor 62, the third motor 63, the fourth motor 64, and the fifth motor 65 are not distinguished from one another, each of these motors is referred to simply as the "motor 6."

Each of the links 30 has a hollow shape and has an internal space. The internal space of each link 30 serves as a container room that houses a component. For example, the motor 6 is housed in the internal space of the link 30. Specifically, the first motor 61 and the second motor 62 are housed in the internal space of the first link 31. The third motor 63 is housed in the internal space of the second link 32. The fourth motor 64 and the fifth motor 65 are housed in the internal space of the third link 33.

The base 1 of the robot 100 is displaced toward one of the front wall 111a and the rear wall 111b from the center of the casing 111 in the front-rear direction. Specifically, the base 1 is disposed closer to the rear wall 111b than the front wall 111a. In the left-right direction, the base 1 is located substantially at the center of the casing 111. In this manner, since the base 1 is displaced toward one of the front wall 111a and the rear wall 111b from the center of the casing 111 in the front-rear direction, the links 30 are elongated so that the hands 8 are movable in larger areas.

Figure 3:
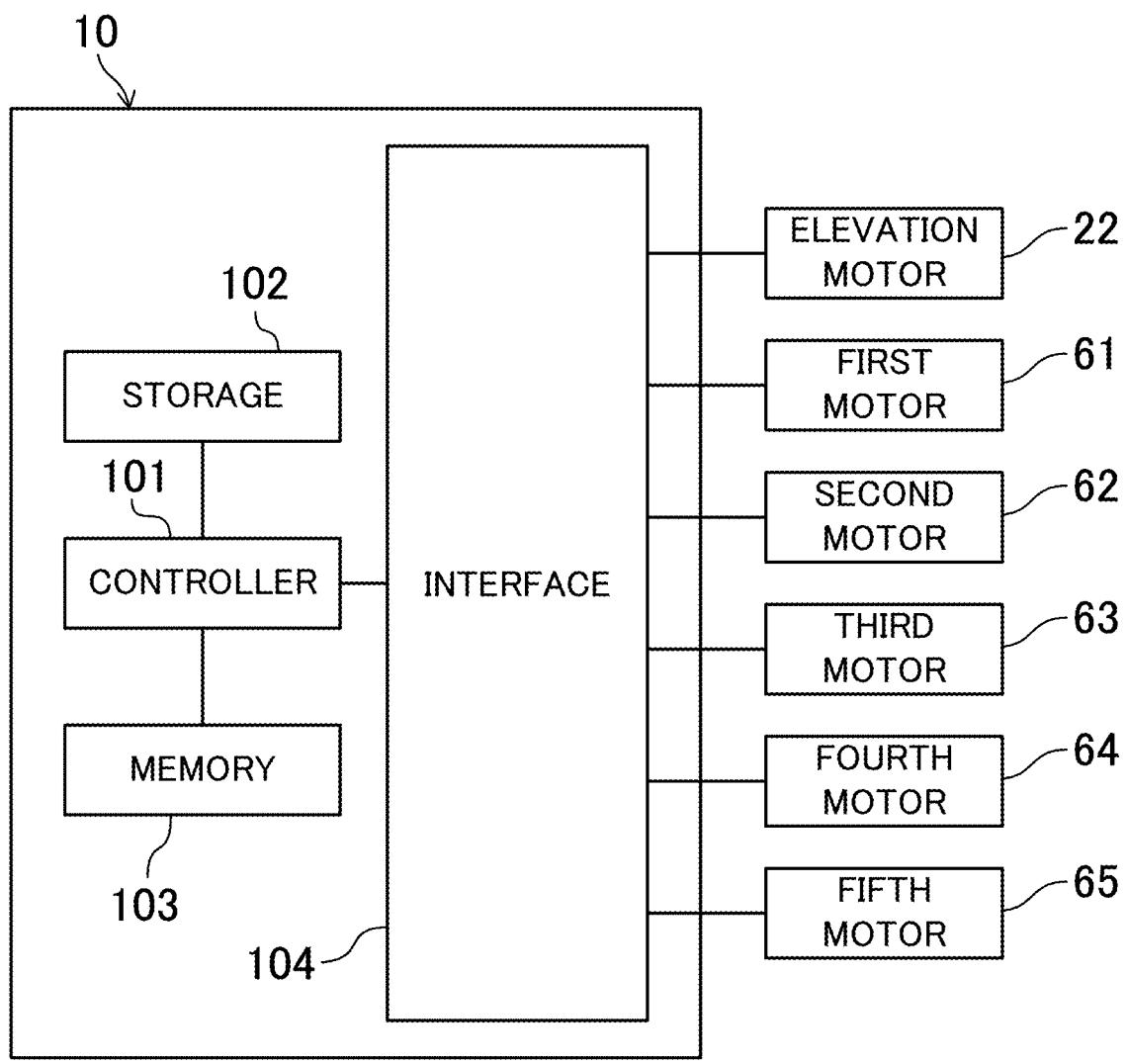
FIG. 3 is a functional block diagram of the robot.

FIG. 3 is a functional block diagram of the robot 100. The robot 100 further includes a control device 10. The control device 10 includes a controller 101 that controls the entire robot 100, a storage 102 that stores various programs and various types of data, a memory 103, and an interface 104 connected to, for example, the motors 6.

The storage 102 is a recording medium readable by a computer, and is constituted by, for example, a flash memory. The storage 102 may also be constituted by, for example, an optical disk such as a CD-ROM. The storage 102 stores various programs and various types of data necessary for executing processing of the controller 101.

The controller 101 controls, for example, the motors 6 based on programs stored in the storage 102. The controller 101 is constituted by, for example, a processor such as a central processing unit (CPU). The controller 101 executes various types of processing by developing programs stored in, for example, the storage 102 in the memory 103 to thereby execute processing. The controller 101 may be implemented by hardware such as large scale integration (LSI) having a function similar to that of a processor.

The elevation motor 22, the first motor 61, the second motor 62, the third motor 63, the fourth motor 64, and the fifth motor 65 are connected to the interface 104. Depending on a mode of the end effectors, actuators (holding actuators in the case of the hands 8) for operating the end effectors are also connected to the interface 104.

The control device 10 controls the motors 6 and other components based on a predetermined operation program or an operation command input from a user to control the robot 100. The control device 10 displaces the arm 3, or causes the hand 8 to hold or release the substrate S.

For example, the control device 10 displaces the arm 3 and the hand 8 so that the hand 8 enters the internal space of the FOUP 121A (see solid lines in FIG. 2). Then, the control device 10 causes the hand 8 to hold the substrate S in the FOUP 121A. The control device 10 causes the hand 8 holding the substrate S to retract from the FOUP 121A to the transfer space 112 and then to enter the processor 121B (see chain double-dashed lines in FIG. 2). The control device 10 causes the hand 8 to release the substrate S at a predetermined position in the processor 121B. Thereafter, the control device 10 causes the hand 8 to temporarily retract from the processor 121B. The processor 121B performs predetermined processing on the substrate S. After the processing on the substrate S, the control device 10 causes the hand 8 to enter the processor 121B and hold the substrate S. The control device 10 causes the hand 8 holding the substrate S to retract from the processor 121B to the transfer space 112 and then to enter the FOUP 121A. The control device 10 causes the hand 8 to release the substrate S at a predetermined position in the FOUP 121A. In the manner described above, the control device 10 causes the robot 100 to transfer the substrate S between the FOUP 121A and the processor 121B.

<Housing of Motor 6 in Arm 3>

Figure 4:
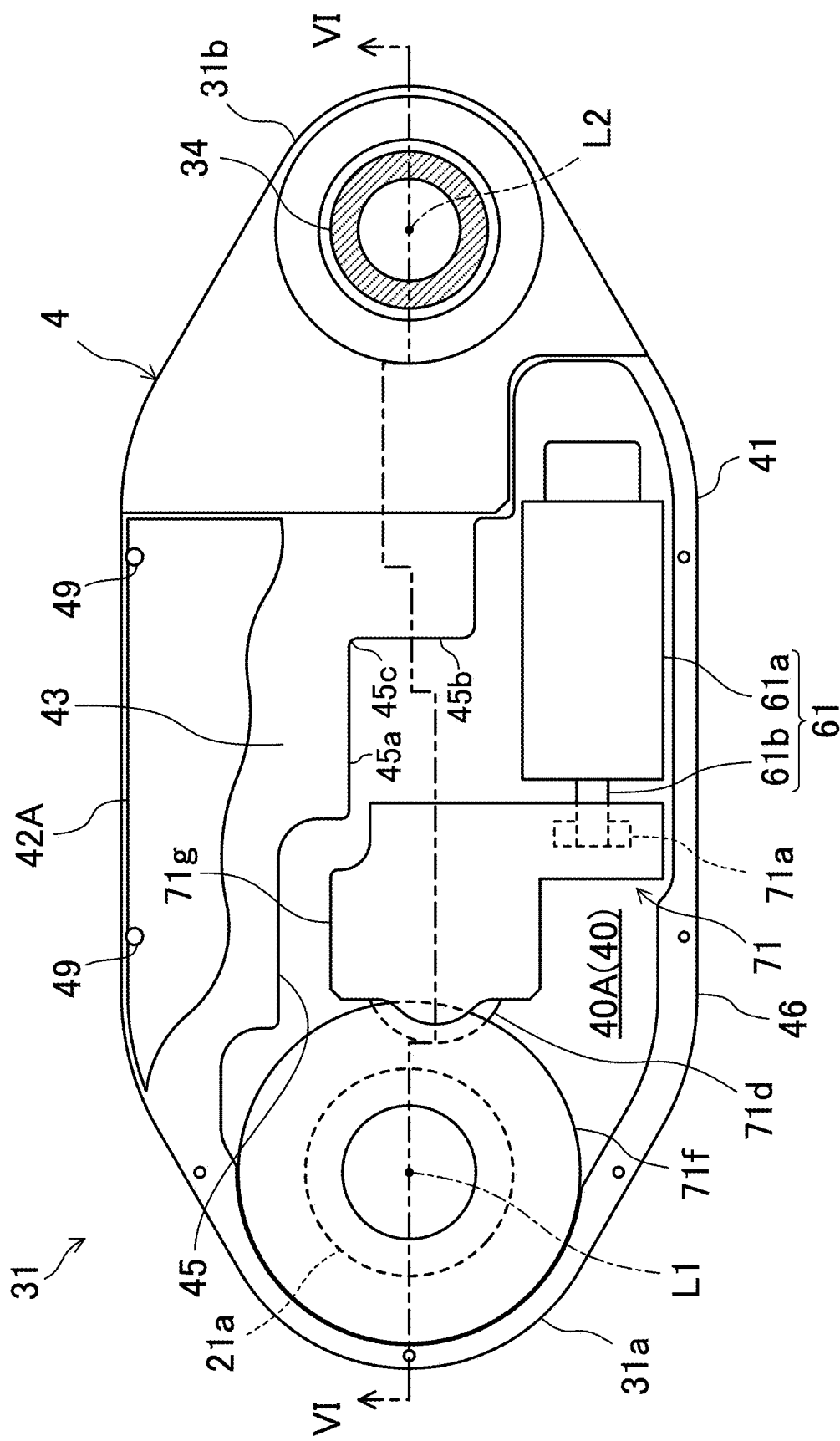
FIG. 4 is a plan view of a first link with a first lid partially cut away.
Figure 5:
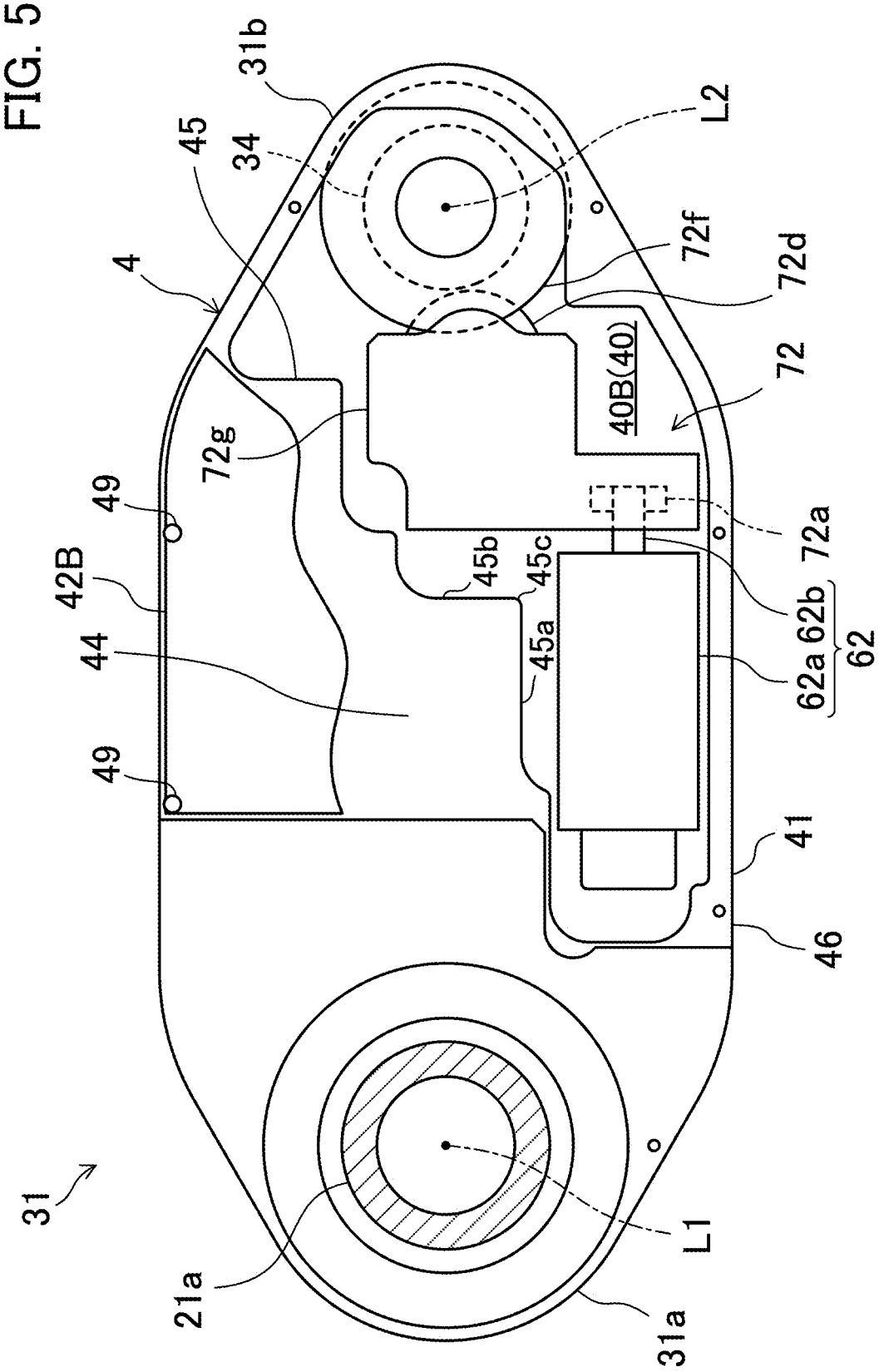
FIG. 5 is a bottom view of the first link with a second lid partially cut away.
Figure 6:
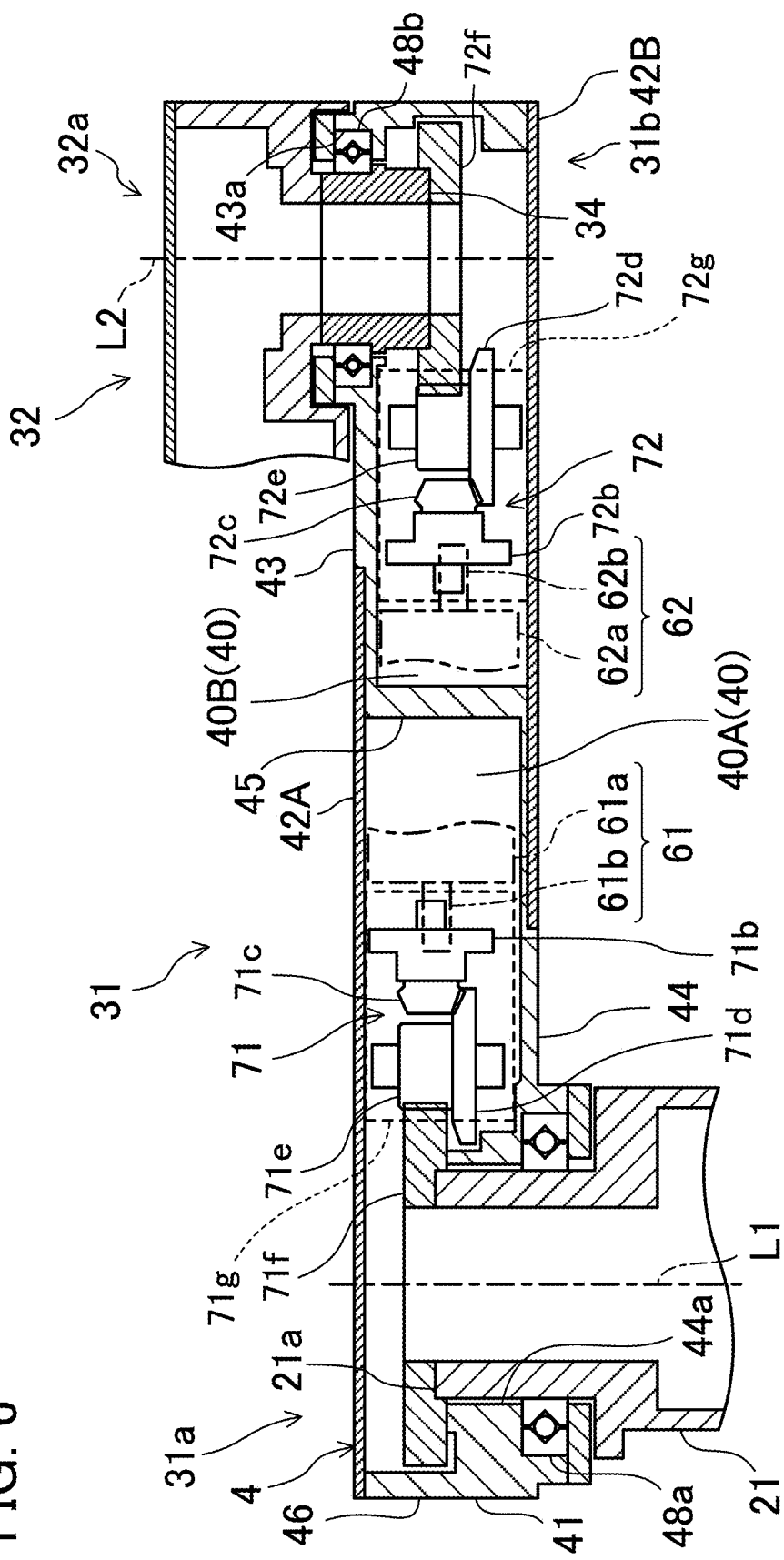
FIG. 6 is a schematic cross-sectional view of the first link taken along line VI-VI in FIG. 4.

Next, housing of the motors 6 in the links 30 will be described. FIG. 4 is a plan view of the first link 31 with a first lid 42A partially cut away. FIG. 5 is a bottom view of the first link 31 with a second lid 42B partially cut away. FIG. 6 is a schematic cross-sectional view of the first link 31 taken along line VI-VI in FIG. 4.

First, housing of the motors 6 in the first link 31 will be described. The number of motors 6 housed in the first link 31 is two. The first link 31 has an internal space 40 for housing components. The first link 31 includes a partition 45 that partitions the internal space 40 into two container rooms for housing the components. The two container rooms are a first container room 40A for housing the first motor 61 and a second container room 40B for housing the second motor 62.

Specifically, the first link 31 includes a housing 4 that defines the outer shape of the first link 31. The internal space 40 is formed in the housing 4. The housing 4 includes a housing body 41, and a first lid 42A and a second lid 42B configured to be attached to the housing body 41.

The housing body 41 includes a ceiling wall 43 and a bottom wall 44 that define at least a part of the internal space 40 and are separated from each other in the vertical direction. The housing body 41 also includes a peripheral wall 46 that defines an outer shape of the first link 31 in a plan view and has an annular shape.

The peripheral wall 46 extends annularly along the outer shape, that is, the contour, of the first link 31 in the plan view. The peripheral wall 46 has a width in the vertical direction (i.e., height) and also extends in the vertical direction.

The ceiling wall 43 is combined with the upper end of the peripheral wall 46 to close a part of an opening at the upper end of the peripheral wall 46 including the second end 31b of the first link 31. The bottom wall 44 is combined with the lower end of the peripheral wall 46 to close a part of an opening in the lower end of the peripheral wall 46 including the first end 31a of the first link 31. The ceiling wall 43 and the bottom wall 44 are arranged side by side in the longitudinal direction of the first link 31 in a plan view.

The partition 45 extends from the ceiling wall 43 to the bottom wall 44 across the internal space 40. That is, the partition 45 crosses the internal space 40 in the vertical direction. The upper end of the partition 45 is coupled to the ceiling wall 43. The lower end of the partition 45 is coupled to the bottom wall 44.

The partition 45 extends across the inside of the peripheral wall 46 and is coupled to at least two portions of the peripheral wall 46. At this time, the partition 45 extends across the internal space 40 to be inclined as a whole with respect to the longitudinal direction of the first link 31 in a plan view. More specifically, the partition 45 has a zigzag pattern in a plan view. The partition 45 includes corners 45c each formed by longitudinal portions 45a extending along the longitudinal direction of the first link 31 and lateral portions 45b extending along the lateral direction of the first link 31. The partition 45 is formed such that the longitudinal portions 45a and the lateral portions 45b are alternately arranged and connected to one another. That is, the partition 45 includes the corners 45c.

The partition 45 is integrated with the ceiling wall 43 and the bottom wall 44. Specifically, the ceiling wall 43, the bottom wall 44, and the partition 45 are formed of a single member. In addition, the peripheral wall 46 is also integrated with the ceiling wall 43, the bottom wall 44, and the partition 45. Specifically, the ceiling wall 43, the bottom wall 44, the partition 45, and the peripheral wall 46 are formed of a single member. That is, the partition 45 and the housing body 41 are formed of a single member. For example, the housing body 41 is formed by cutting a metal as a single member. At this time, the partition 45 is cut out integrally with the housing body 41 as a part of the housing body 41. In other words, the ceiling wall 43, the bottom wall 44, the partition 45, and the peripheral wall 46 are combined together seamlessly without a joint by welding, for example.

The thus-configured housing body 41 has the first container room 40A that is open upward and the second container room 40B that is open downward. The first container room 40A is formed in a portion of the housing body 41 near the first end 31a, including the first end 31a. The second container room 40B is formed in a portion of the housing body 41 near the second end 31b, including the second end 31b.

The bottom wall 44 defines a lower portion of the first container room 40A. Specifically, the first container room 40A is defined by the peripheral wall 46, the bottom wall 44, and the partition 45. The first lid 42A is attached to the upper edge of the peripheral wall 46 with screws 49. The first container room 40A is closed by the first lid 42A.

The ceiling wall 43 defines an upper portion of the second container room 40B. Specifically, the second container room 40B is defined by the peripheral wall 46, the ceiling wall 43, and the partition 45. The second lid 42B is attached to the lower edge of the peripheral wall 46 with screws 49. The second container room 40B is closed by the second lid 42B.

A part of the movable part 21 extending from the base 1 is disposed in the first container room 40A. Specifically, an upper end portion of the movable part 21 is formed of a first shaft 21a. The bottom wall 44 in the first end 31a has an insertion hole 44a through which the first shaft 21a penetrates. The first shaft 21a is not rotatable with respect to the base 1. The first shaft 21a enters the first container room 40A through the insertion hole 44a. The first shaft 21a is rotatably supported by a bearing 48a disposed in the first container room 40A. The axis of the first shaft 21a coincides with the first axis L1. The bearing 48a is fixed to the housing body 41. Accordingly, the housing body 41 is rotatable relative to the first shaft 21a through the bearing 48a. That is, the first link 31 is rotatable relative to the base 1.

The first container room 40A houses the first motor 61 and a first transfer mechanism 71 that transfers a driving force of the first motor 61.

The first motor 61 includes a motor body 61a fixed to the housing body 41 and a rotation shaft 61b extending from the motor body 61a. The first motor 61 is, for example, an electric motor, and specifically a servo motor. The first motor 61 includes an encoder (not shown) for detecting a rotation position or a rotation amount of the rotation shaft 61b. The first motor 61 is disposed in the first container room 40A in a state where the rotation shaft 61b extends horizontally (specifically, in the longitudinal direction of the first link 31).

The first transfer mechanism 71 transfers a driving force of the first motor 61 to the first shaft 21a. The first transfer mechanism 71 has a gear train. The gear train includes a first gear 71a coaxially attached to the rotation shaft 61b, a second gear 71b to which rotation of the first gear 71a is transferred through one or more gears (not shown), a third gear 71c that rotates together with the second gear 71b, a fourth gear 71d that meshes with the third gear 71c, a fifth gear 71e that rotates together with the fourth gear 71d, and a sixth gear 71f that meshes with the fifth gear 71e and is coaxially attached to the first shaft 21a. The second gear 71b and the third gear 71c rotate together about an axis extending horizontally. The third gear 71c and the fourth gear 71d are bevel gears. The fourth gear 71d and the fifth gear 71e rotate together about an axis extending in parallel with the first axis L1. The first gear 71a, the second gear 71b, the third gear 71c, the fourth gear 71d, and the fifth gear 71e are housed in a gear box 71g. The gearbox 71g is disposed in the first container room 40A.

When the first motor 61 operates, rotation of the rotation shaft 61b is transferred to the first shaft 21a through the gear train including the first gear 71a and other gears. Since the first shaft 21a is not rotatable, the housing 4 to which the first motor 61 is fixed rotates about the first axis L1. Accordingly, the first link 31 rotates about the first axis L1 relative to the base 1.

A part of the second shaft 34 extending from the second link 32 is disposed in the second container room 40B. The ceiling wall 43 in the second end 31b has an insertion hole 43a through which the second shaft 34 penetrates. The second shaft 34 is non-rotatably attached to the second link 32. The distal end of the second shaft 34 enters the second container room 40B through the insertion hole 43a. The second shaft 34 is rotatably supported by the bearing 48b disposed in the second container room 40B. The axis of the second shaft 34 coincides with the second axis L2. The bearing 48b is fixed to the housing body 41. Accordingly, the second shaft 34 is rotatable relative to the housing body 41 through the bearing 48b. That is, the second link 32 is rotatable relative to the first link 31.

The second container room 40B houses the second motor 62 and a second transfer mechanism 72 that transfers a driving force of the second motor 62.

The second motor 62 includes a motor body 62a fixed to the housing body 41 and a rotation shaft 62b extending from the motor body 62a. The second motor 62 is, for example, an electric motor, and specifically a servo motor. The second motor 62 includes an encoder (not shown) for detecting a rotation position or a rotation amount of the rotation shaft 62b. The second motor 62 is disposed in the second container room 40B in a state where the rotation shaft 62b extends horizontally (specifically, in the longitudinal direction of the first link 31).

The second transfer mechanism 72 transfers a driving force of the second motor 62 to the second shaft 34. The second transfer mechanism 72 has a gear train. The gear train includes a first gear 72a coaxially attached to the rotation shaft 62b, a second gear 72b to which rotation of the first gear 72a is transferred through one or more gears (not shown), a third gear 72c that rotates together with the second gear 72b, a fourth gear 72d that meshes with the third gear 72c, a fifth gear 72e that rotates together with the fourth gear 72d, and a sixth gear 72f that meshes with the fifth gear 72e and is coaxially attached to the second shaft 34. The second gear 72b and the third gear 72c rotate together about an axis extending horizontally. The third gear 72c and the fourth gear 72d are bevel gears. The fourth gear 72d and the fifth gear 72e rotate together about an axis extending in parallel with the second axis L2. The first gear 72a, the second gear 72b, the third gear 72c, the fourth gear 72d, and the fifth gear 72e are housed in a gear box 72g. The gear box 72g is disposed in the second container room 40B.

When the second motor 62 operates, rotation of the rotation shaft 62b is transferred to the second shaft 34 through the gear train including the first gear 72a and other gears. Since the second motor 62 is fixed to the housing 4, the second shaft 34 rotates about the second axis L2. Accordingly, the second link 32 rotates about the second axis L2 relative to the first link 31.

In the housing body 41, the first container room 40A and the second container room 40B are open in opposite directions in the direction of the first axis L1 or the second axis L2 (i.e., the vertical direction). Specifically, the first container room 40A is open toward the ceiling wall 43, and the second container room 40B is open toward the bottom wall 44. In placing the first motor 61 and the gear box 71g in the first container room 40A, a user accesses the first container room 40A from the side at the ceiling wall 43. On the other hand, in placing the second motor 62 and the gear box 72g in the second container room 40B, the user accesses the second container room 40B from the side at the bottom wall 44.

Next, housing of the motor 6 in the second link 32 will be described. The number of motors 6 housed in the second link 32 is one. Since the second link 32 does not need to house two motors 6, the width of the second link 32 is smaller than the width of the first link 31. The internal space of the second link 32 houses the third motor 63 and a third transfer mechanism (not shown) that transfers a driving force of the third motor 63. The third motor 63 and the third transfer mechanism have similar configuration and arrangement to those of the second motor 62 and the second transfer mechanism 72. Specifically, a part of the third shaft 35 (see FIG. 7) extending from the third link 33 is disposed in a portion of the internal space of the second link 32 corresponding to the second end 32b. The third shaft 35 extends coaxially with the third axis L3. The third transfer mechanism transfers a driving force of the third motor 63 to the third shaft.

When the third motor 63 operates, rotation of the third motor 63 is transferred to the third shaft 35 through a gear train. Since the third motor 63 is fixed to the housing of the second link 32, the third shaft 35 rotates about the third axis L3. Accordingly, the third link 33 rotates about the third axis L3 relative to the second link 32.

Figure 7:
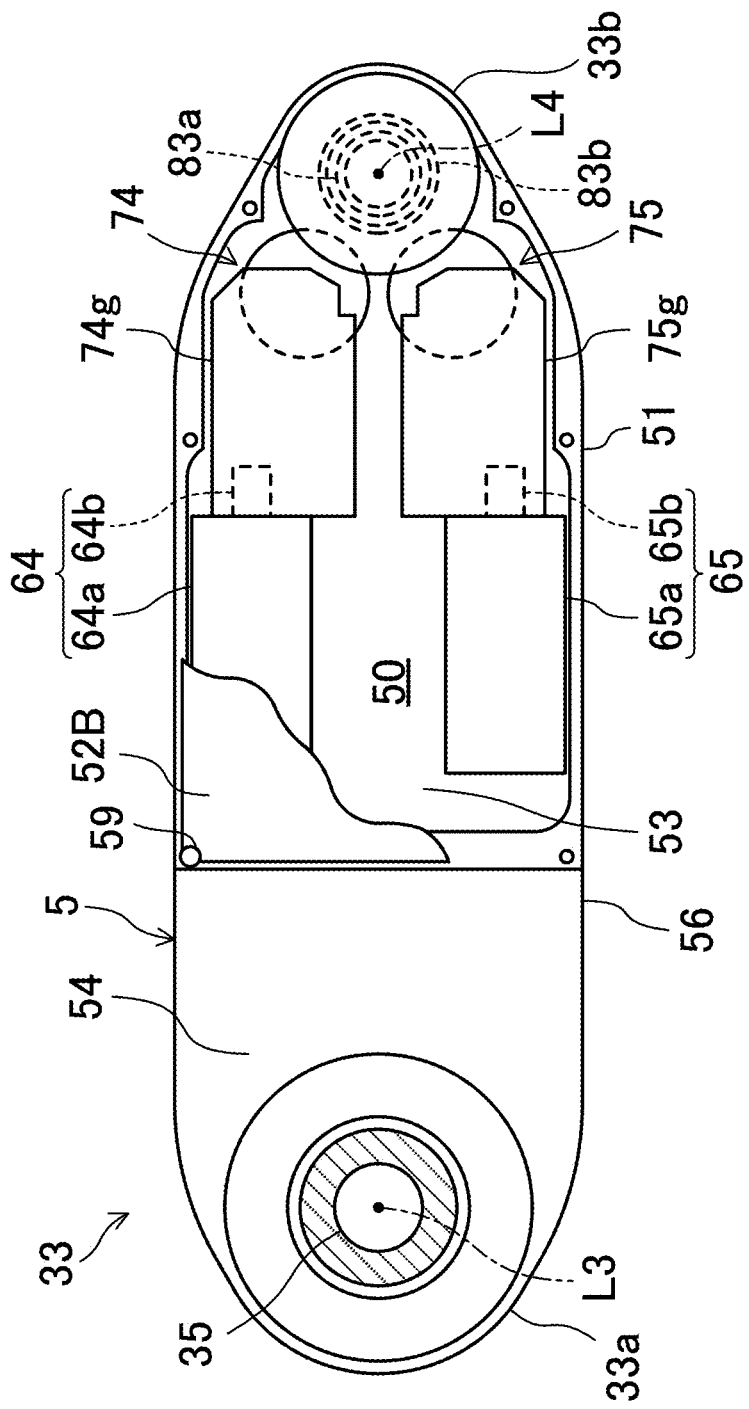
FIG. 7 is a bottom view of a third link with the second lid partially cut away.

Then, housing of the motors 6 in the third links 33 will be described. FIG. 7 is a bottom view of the third link 33 with the second lid 52B partially cut away. The number of motors 6 housed in the third link 33 is two. The third link 33 has an internal space 50 that houses the fourth motor 64 and the fifth motor 65.

Specifically, the third link 33 includes a housing 5 that defines the outer shape of the third link 33. The internal space 50 is formed in the housing 5. The housing 5 includes a housing body 51, and a first lid (not shown) and a second lid 52B configured to be attached to the housing body 51.

The housing body 51 includes a ceiling wall 53, a bottom wall 54, and a peripheral wall 56 that define at least a part of the internal space 50.

The peripheral wall 56 extends along the outer shape, that is, the contour, of the third link 33 in a plan view. The peripheral wall 56 has a width in the vertical direction (i.e., height) and also extends in the vertical direction.

The bottom wall 54 is combined with the lower end of the peripheral wall 56 to close a part of an opening in the lower end of the peripheral wall 56 including a first end 33a of the third link 33. The ceiling wall 53 is combined with the upper end of the peripheral wall 56 to close a part of an opening in the upper end of the peripheral wall 56 including the second end 33b of the third link 33.

The ceiling wall 53, the bottom wall 54, and the peripheral wall 56 are formed of a single member. For example, the housing body 51 is formed by cutting a metal as a single member. In other words, the ceiling wall 53, the bottom wall 54, and the peripheral wall 56 are joined together seamlessly without a joint by welding, for example.

A portion of the internal space 50 of the thus-configured housing body 51 located near the first end 33a, including first end 33a, is open upward. On the other hand, a portion of the internal space 50 located near the second end 33b, including the second end 33b, is open downward. Although not shown, a first lid is attached to the upper edge of the peripheral wall 56 with screws. The first lid closes a portion of the internal space 50 that is open upward. On the other hand, a second lid 52B is attached to the lower edge of the peripheral wall 56 with screws 59. The second lid 52B closes a portion of the internal space 50 that is open downward. The portion of the internal space 50 that is open upward and the portion of the internal space 50 that is open downward are not separated by such a wall as the partition 45 of the first link 31.

The third shaft 35 is non-rotatably attached to the bottom wall 54. The third shaft 35 extends coaxially with the third axis L3. One end of the third shaft 35 is disposed in the internal space 50, and the other end (not shown) of the third shaft 35 enters the internal space of the second link 32.

Parts of shafts extending from the hands 8 are disposed in the internal space 50. Specifically, a cylindrical fourth shaft 83a is non-rotatably coupled to the body 81 of the first hand 8A. The fourth shaft 83a extends coaxially with the fourth axis L4. A cylindrical fifth shaft 83b is non-rotatably coupled to the body 81 of the second hand 8B. The fifth shaft 83b passes through the inside of the fourth shaft 83a and extends coaxially with the fourth axis L4. The fourth shaft 83a and the fifth shaft 83b are rotatably supported by bearings disposed in the internal space 50. The bearings are fixed to the housing body 51. Accordingly, the first hand 8A and the second hand 8B are rotatable relative to the housing body 51 through the bearings. That is, the first hand 8A and the second hand 8B are rotatable relative to the third link 33. The first hand 8A and the second hand 8B are rotatable independently of each other.

The internal space 50 houses the fourth motor 64, a fourth transfer mechanism 74 that transfers a driving force of the fourth motor 64, a fifth motor 65, and a fifth transfer mechanism 75 that transfers a driving force of the fifth motor 65.

The fourth motor 64 includes a motor body 64a fixed to the housing body 51 and a rotation shaft 64b extending from the motor body 64a. The fourth motor 64 is, for example, an electric motor, and specifically a servo motor. The fourth motor 64 includes an encoder (not shown) for detecting a rotation position or a rotation amount of the rotation shaft 64b. The fourth motor 64 is disposed in the internal space 50 in a state where the rotation shaft 64b extends horizontally (specifically, in the longitudinal direction of the third link 33).

The fourth transfer mechanism 74 transfers a driving force of the fourth motor 64 to the fourth shaft 83a. The fourth transfer mechanism 74 has a gear train. Although not shown, the gear train includes a first gear coaxially attached to the rotation shaft 64b, a sixth gear coaxially attached to the fourth shaft 83a, and intermediate gears that transfer rotation of the first gear to the sixth gear. The gear train is housed in the gear box 74g. The gear box 74g is disposed in the internal space 50.

When the fourth motor 64 operates, rotation of the rotation shaft 64b is transferred to the fourth shaft 83a through the gear train. Since the fourth motor 64 is fixed to the housing 5, the fourth shaft 83a rotates about the fourth axis L4. Accordingly, the first hand 8A rotates about the fourth axis L4 relative to the third link 33.

The fifth motor 65 includes a motor body 65a fixed to the housing body 51 and a rotation shaft 65b extending from the motor body 65a. The fifth motor 65 is, for example, an electric motor, and specifically a servo motor. The fifth motor 65 includes an encoder (not shown) for detecting a rotation position or a rotation amount of the rotation shaft 65b. The fifth motor 65 is disposed in the internal space 50 in a state where the rotation shaft 65b extends horizontally (specifically, in the longitudinal direction of the third link 33).

The fifth transfer mechanism 75 transfers a driving force of the fifth motor 65 to the fifth shaft 83b. The fifth transfer mechanism 75 has a gear train. Although not shown, the gear train includes a first gear coaxially attached to the rotation shaft 65b, a sixth gear coaxially attached to the fifth shaft 83b, and intermediate gears that transfer rotation of the first gear to the sixth gear. The gear train is housed in the gear box 75g. The gear box 75g is disposed in the internal space 50.

When the fifth motor 65 operates, rotation of the rotation shaft 65b is transferred to the fifth shaft 83b through the gear train. Since the fifth motor 65 is fixed to the housing 5, the fifth shaft 83b rotates about the fourth axis L4. Accordingly, the second hand 8B rotates about the fourth axis L4 relative to the third link 33.

In the third link 33 as described above, the two motors 6 are housed in the non-partitioned internal space 50. The fourth motor 64 and the fifth motor 65 are disposed side by side in the lateral direction of the third link 33. Accordingly, the fourth transfer mechanism 74 and the fifth transfer mechanism 75 are disposed side by side in the lateral direction of the third link 33.

The thus-configured arm 3 is coupled to the base 1 in a cantilever manner, and is rotationally displaced and deformed. Accordingly, a dead weight and an inertial force of the arm 3 are exerted on each link 30. Since the first link 31 includes the partition 45 that partitions the internal space 40 into the first container room 40A and the second container room 40B, rigidity (specifically, flexural rigidity or torsional rigidity) of the first link 31 is higher than that in a configuration including no partition 45. As a result, positioning accuracy of the arm 3, and consequently, positioning accuracy of the hand 8, can be increased.

In particular, since the first link 31 houses the two motors 6 (the first motor 61 and the second motor 62), the first link 31 has a large dead weight. In addition, since the first link 31 is the link 30 closest to the base 1 among the links 30, the weights of the other links 30 and the hands 8 are exerted on the first link 31. Further, since the first link 31 is the longest in the three links 30, the first link 31 is easily warped. Thus, an increase in rigidity of the first link 31 is effective for increasing rigidity of the entire arm 3.

Specifically, as illustrated in FIGS. 4 through 6, the partition 45 is combined with the ceiling wall 43 and the bottom wall 44. More specifically, the ceiling wall 43, the bottom wall 44, and the partition 45 are bent in a crank shape as a whole. Accordingly, flexural rigidity and/or torsional rigidity of the first link 31 increases. In addition, the partition 45 is disposed across the inside of the annular peripheral wall 46 and combined with two portions of the peripheral wall 46. Accordingly, flexural rigidity and/or torsional rigidity of the peripheral wall 46 increases, and as a result, rigidity of the first link 31 further increases.

Furthermore, the partition 45 extends to be inclined as a whole with respect to the lateral direction of the first link 31 in a plan view. That is, a region where the partition 45 is present is elongated in the longitudinal direction of the first link 31. Accordingly, a portion whose rigidity is reinforced by the partition 45 can be enlarged along the longitudinal direction of the first link 31. As a result, rigidity of the first link 31 further increases.

The partition 45 has the corners 45c. Accordingly, rigidity of the partition 45 increases. In addition, since partition 45 includes the corners 45c, rigidity of the partition 45 further increases. As a result, rigidity of the first link 31 further increases.

Moreover, since the partition 45 is inclined as a whole with respect to the lateral direction of the first link 31 in a plan view, the internal space 40 of the first link 31 can be effectively utilized. Specifically, since the partition 45 is inclined as a whole with respect to the lateral direction of the first link 31 in a plan view, each of the first container room 40A and the second container room 40B is elongated in the longitudinal direction of the first link 31, as compared to a configuration in which the partition 45 extends in the lateral direction of the first link 31. Since the first shaft 21a and the gear box 71g are adjacent to each other and the gear box 71g and the first motor 61 are adjacent to each other, space occupied by each of the first shaft 21a, the gear box 71g, and the first motor 61 tends to be slender as a whole. Thus, the first container room 40A is made elongated in the longitudinal direction of the first link 31 so that the internal space 40 of the first link 31 can be effectively utilized for disposing the first shaft 21a, the gear box 71g, and the first motor 61.

Similarly, since the second shaft 34 and the gear box 72g are adjacent to each other and the gear box 72g and the second motor 62 are adjacent to each other, space occupied by each of the second shaft 34, the gear box 72g, and the second motor 62 tends to be slender as a whole. Thus, the second container room 40B is made elongated in the longitudinal direction of the first link 31 so that the internal space 40 of the first link 31 can be effectively utilized for disposing the second shaft 34, the gear box 72g, and the second motor 62.

As described above, the robot 100 includes the base 1, the arm 3 formed by the links 30 coupled to one another to be rotatable horizontally, and the hands 8 (end effectors) coupled to the arm 3 to be rotatable horizontally, the first link 31 that is at least one of the links 30 has the internal space 40, and the first link 31 includes the partition 45 that partitions the internal space 40 into two container rooms for individually housing components, that is, the first container room 40A and the second container room 40B.

With this configuration, the partition 45 increases rigidity of the first link 31. Specifically, the first link 31 has the internal space 40 for housing the component, and has a hollow shape. The internal space 40 is partitioned by the partition 45 into two container rooms for housing components, that is, the first container room 40A and the second container room 40B. By partitioning the internal space 40 into the first container room 40A and the second container room 40B, components can be easily housed orderly. That is, as compared a case where the components are housed in a single space, the components can be divided into container rooms, that is, orderly housed. In addition, in assembly of the robot 100, as compared to the case of disposing the components in a single space, the container rooms make it easy to find locations of the components to be disposed can be easily assembled. Moreover, the partition 45 serves as a reinforcement in the hollow first link 31. As a result, as compared to a configuration including no partition 45, rigidity, that is, flexural rigidity or torsional rigidity, of the first link 31 can be increased.

The components include the links 30 and the motors 6 for rotationally driving the hands 8, and each of the first container room 40A and the second container room 40B houses one of the motors 6.

Specifically, the first container room 40A houses the first motor 61, and the second container room 40B houses the second motor 62.

In this configuration, since the first link 31 houses two motors 6, the first link 31 has a heavy total weight. Thus, increase in rigidity by providing the partition 45 in the first link 31 is significantly effective.

The first link 31 includes the ceiling wall 43 and the bottom wall 44 that define at least a part of the internal space 40 and are separated from each other in the vertical direction. The partition 45 extends from the ceiling wall 43 to the bottom wall 44.

In this configuration, the ceiling wall 43 and the bottom wall 44 are combined with each other by the partition 45. Accordingly, rigidity of the ceiling wall 43, the bottom wall 44, and the partition 45 as a whole increases. As a result, rigidity of the first link 31 increases.

In addition, the bottom wall 44 defines a lower portion of the first container room 40A that is one of the two container rooms. The first container room 40A is open upward. The ceiling wall 43 defines an upper portion of the second container room 40B that is the other of the two container rooms. The second container room 40B is open downward.

In this configuration, one container room is open upward, and the other container room is open downward. The thus-configured container rooms can be easily obtained by the partition 45 extending from the ceiling wall 43 to the bottom wall 44.

The first link 31 includes the housing 4 that defines the outer shape of the first link 31. The housing 4 includes the housing body 41 having the ceiling wall 43 and the bottom wall 44. The partition 45 and the housing body 41 are formed of a single member.

In this configuration, since the housing body 41 and the partition 45 are formed of the single member, the housing body 41 and the partition 45 can be firmly coupled together, as compared to a configuration in which the partition 45 is attached to the housing body 41. As a result, rigidity of the first link 31 further increases.

The first link 31 includes the peripheral wall 46 that defines the outer shape of the first link 31 in a plan view and has an annular shape. The partition 45 extends across the inside of the peripheral wall 46 and is combined with at least two portions of the peripheral wall 46.

In this configuration, the partition 45 increases rigidity of the peripheral wall 46. As a result, rigidity of the first link 31 further increases.

The partition 45 includes the corners 45c that are formed to bend.

In this configuration, rigidity of the partition 45 increases, as compared to a case where the partition 45 is flat. Since rigidity of the partition 45 itself increases, rigidity of the first link 31 further increases.

The links 30 are three links 30.

In this configuration, positioning accuracy of the end effectors tends to be lower than an arm formed by one or two links. In view of this, rigidity of the first link 31 that is one of the three links 30 is increased so that positioning accuracy of the end effectors can be increased. That is, in the arm 3 formed by the three links 30, an increase in rigidity of the arm 3 by the partition 45 can be especially effective.

In addition, the first link 31 is one of the links 30 coupled to the base 1.

In this configuration, weights of the other links 30 and the hands 8 are exerted on the first link 31. Thus, an increase in rigidity of the first link 31 is effective for increasing rigidity of the entire arm 3.

The hands 8 are an example of the end effectors and holds the substrate S.

In this configuration, the robot 100 transfers the substrate S. An increase in rigidity of the arm 3 can increase positioning accuracy of the substrate S.

The hand 8 holds a semiconductor wafer as the substrate S. The arm 3 and the hand 8 transfer the semiconductor wafer between the FOUP 121A that is an enclosure for housing the semiconductor wafer and the processor 121B for processing the semiconductor wafer.

In this configuration, the robot 100 transfers a semiconductor wafer between the FOUP 121A and the processor 121B. Since a semiconductor wafer is fragile and processing of the semiconductor wafer needs to be detailed, transfer of the semiconductor wafer requires high positioning accuracy. Thus, an increase in rigidity of the arm 3 is especially effective.

The substrate transfer system 110 includes the casing 11 and the robot 100 disposed in the casing 111. The robot 100 transfers substrates S between the FOUPs 121A adjacent to the casing 111 and configured to house the substrates S and the processors 121B adjacent to the casing 111 and configured to process the substrates S.

In this configuration, the robot 100 is incorporated in the substrate transfer system 110 that transfers the substrates S between the FOUPs 121A and the processors 121B. Since the arm 3 of the robot 100 has high rigidity, the substrate transfer system 110 can transfer the substrates S with high positioning accuracy.

Other Embodiments

In the foregoing section, the embodiment has been described as an example of the technique disclosed in the present application. The technique disclosed here, however, is not limited to this embodiment, and is applicable to other embodiments obtained by changes, replacements, additions, and/or omissions as necessary. Components described in the embodiment described above may be combined as a new exemplary embodiment. Components provided in the accompanying drawings and the detailed description can include components unnecessary for solving problems as well as components necessary for solving problems in order to exemplify the technique. Therefore, it should not be concluded that such unnecessary components are necessary only because these unnecessary components are included in the accompanying drawings or the detailed description.

For example, although the robot 100 is incorporated in the substrate transfer system 110, the present disclosure is not limited to this example. The robot 100 is not limited to use in an environment that is clean enough to enable processing of a semiconductor. The robot 100 may be incorporated in, for example, a production line.

The substrate transfer system 110 may not be incorporated in the substrate processing apparatus 120. That is, the substrate transfer system 110 can have any configuration as long as the robot 100 transfers the substrate S in the casing 111. The origin and destination of transfer of the substrate S are not limited to the FOUPs 121A and the processors 121B.

The number of divisions of the arm 3, that is, the number of the links 30, is not limited to 3. The arm 3 may be formed by two or four or more links 30.

The end effectors are not limited to the hands 8. For example, the end effectors may be coating tools or welding tools. Even in the case where the end effectors are the hands 8, an object to be held by the hand 8 is not limited to a substrate. The number of the hands 8 (i.e., the number of end effectors) is not limited to two, and may be one or three or more.

Although the robot 100 includes the same number of the motors 6 as the sum of the links 30 and the hands 8, the number of the motors 6 may not be equal to the sum of the links 30 and the hands 8. For example, one motor 6 may rotationally drive two links 30.

The link 30 housing two motors 6 and having the partition 45 may be a link 30 other than the first link 31. The second link 32 or the third link 33 may have a partition and house two motors 6.

As described above, in the configuration in which the third link 33 houses two motors 6 (the fourth motor 64 and the fifth motor 65), the third link 33 may have a partition. For example, the housing body 51 may have a partition partitioning the internal space 50 in a container room for housing the fourth motor 64 and a container room for housing the fifth motor 65. In the configuration illustrated in FIG. 7, the partition can be provided to extend in the longitudinal direction of the third link 33 at the center of the third link 33 in the lateral direction. This partition can be combined with the ceiling wall 53.

The motors 6 housed in two container rooms separated by the partition are not limited to the first motor 61 and the second motor 62, and may be any two of the motors 6. Components housed in the two container rooms are not limited to the motors 6. A component related to driving of the arm 3 and others, such as the harness, and a component related to detection of operation of the arm 3 and others may be individually housed in container rooms.

The partition may have any configuration as long as the partition separates two container rooms. For example, the two container rooms separated by the partition may partially communicate with each other. That is, the two container rooms may not be shut-off completely.

The partition 45 only needs to be connected to at least one of the ceiling wall 43, the bottom wall 44, and the peripheral wall 46. For example, the partition 45 may be coupled only to the bottom wall 44 and may not be combined with the ceiling wall 43 and the peripheral wall 46. In this case, the partition 45 increases rigidity of the bottom wall 44 and, consequently, increases rigidity of the first link 31. Alternatively, the partition 45 may not be combined with the ceiling wall 43 and the bottom wall 44 and may be combined with the peripheral wall 46.

The partition 45 only needs to partition the internal space 40 into at least two container rooms, and may partition the internal space 40 into three or more spaces including two container rooms.

The partition 45 may be flat without the corners 45c. The partition 45 may extend in the longitudinal direction or the lateral direction of the links 30.

The partition 45 may be formed as a separate component from the housing body 41, and may be combined with the housing body 41 by welding or screw fastening, for example. Even with such a configuration, the partition 45 can also increase rigidity of the housing body 41.

Formation of the housing body 41 including the partition 45 using a single member is not limited to cutting. For example, the housing body 41 may be formed by casting.

The substrate S can be a thin film that can be a material for a substrate of a semiconductor device, such as a semiconductor substrate or a glass substrate. Examples of the semiconductor substrate include a silicon substrate and a sapphire substrate. Examples of the glass substrate include a glass substrate for a flat panel display (FPD) and a glass substrate for a micro electro mechanical systems (MEMS).

INDUSTRIAL APPLICABILITY

As described above, the technique disclosed is useful for a horizontal articulated robot and a substrate transfer system including the robot.

DESCRIPTION OF REFERENCE CHARACTERS 100 horizontal articulated robot
110 substrate transfer system
3 arm
30 link
31 first link
40 internal space
40A first container room (container room)
40B second container room (container room)
43 ceiling wall
44 bottom wall
45 partition
46 peripheral wall
6 motor
61 first motor
62 second motor
8 hand (end effector)
111 casing
121A FOUP (enclosure)
121B processor

The invention claimed is:

1. A horizontal articulated robot comprising:
a base;
an arm coupled to the base to be rotatable horizontally and formed by links, the links being coupled to one another to be rotatable horizontally; and
an end effector coupled to the arm to be rotatable horizontally, wherein
at least one link of the links has an internal space, and
the at least one link has a partition partitioning the internal space into two container rooms, and each of the two container rooms is configured to completely house a component that includes a motor, wherein
the motors of the two container rooms are configured to rotationally drive the links and the end effector,
the at least one link has a ceiling wall and a bottom wall that define at least a part of the internal space and are separated from each other vertically,
the partition extends from the ceiling wall to the bottom wall,
the at least one link includes a housing that defines an outer shape of the at least one link,
the housing includes a housing body having the ceiling wall and the bottom wall,
wherein the partition is located in between the motors, rotation shafts of the motors are orientated in opposite directions, and the ceiling wall, the bottom wall, and the partition are a single integrated structure, and the ceiling wall, the bottom wall, and the partition form an S-shape viewed from a side view.

2. The horizontal articulated robot according to claim 1, wherein
the bottom wall defines a lower portion of a first container room of the two container rooms,
the first container room is open upward,
the ceiling wall defines an upper portion of a second container room of the two container rooms, and
the second container room is open downward.

3. The horizontal articulated robot according to claim 1, wherein
the at least one link has a peripheral wall, the peripheral wall defining an outer shape of the at least one link in a plan view and having an annular shape, and
the partition extends across inside of the peripheral wall and is combined with at least two portions of the peripheral wall.

4. The horizontal articulated robot according to claim 1, wherein the partition has a corner that bends.

5. The horizontal articulated robot according to claim 1, wherein the links are three links.

6. The horizontal articulated robot according to claim 1, wherein the at least one link is one of the links that is coupled to the base.

7. The horizontal articulated robot according to claim 1, wherein the end effector is a hand configured to hold a substrate.

8. The horizontal articulated robot according to claim 7, wherein
the hand holds a semiconductor wafer as the substrate, and
the arm and the hand transfer the semiconductor wafer between an enclosure configured to house the semiconductor wafer and a processor configured to process the semiconductor wafer.

9. A substrate transfer system comprising:
a casing; and
the horizontal articulated robot according to claim 1 disposed in the casing, wherein
the horizontal articulated robot transfers a substrate between an enclosure and a processor, the enclosure being adjacent to the casing and configured to house the substrate, the processor being adjacent to the casing and configured to process the substrate.

10. The horizontal articulated robot according to claim 1, wherein the partition has a corner that bends.

11. The horizontal articulated robot according to claim 2, wherein the partition has a corner that bends.

* * * * *